US010613126B2

(12) United States Patent
Cabaussel et al.

(10) Patent No.: US 10,613,126 B2
(45) Date of Patent: Apr. 7, 2020

(54) METHOD TO DETERMINE THREE-PHASE LOAD IMPEDANCES DRIVEN BY A POWER CONTROL DEVICE WHEN NO NEUTRAL REFERENCE IS AVAILABLE IN AN ALTERNATIVE ELECTRICAL NETWORK

(71) Applicant: Eurotherm Limited, Telford (GB)

(72) Inventors: Remi Cabaussel, Courzieu (FR); Loris Morassutto, Saint Didier de Formans (FR)

(73) Assignee: EUROTHERM LIMITED, Telford, Shropshire (GB)

( * ) Notice: Subject to any disclaimer, the term of this patent is extended or adjusted under 35 U.S.C. 154(b) by 0 days.

(21) Appl. No.: 15/865,456

(22) Filed: Jan. 9, 2018

(65) Prior Publication Data

US 2019/0212374 A1 Jul. 11, 2019

(51) Int. Cl.
| | |
|---|---|
| *G01R 21/133* | (2006.01) |
| *G01R 27/16* | (2006.01) |
| *H02M 7/23* | (2006.01) |
| *H02M 5/458* | (2006.01) |
| *H02M 1/42* | (2007.01) |
| *H02M 5/14* | (2006.01) |
| *H02P 23/14* | (2006.01) |
| *G01R 29/16* | (2006.01) |

(52) U.S. Cl.
CPC ......... *G01R 21/1331* (2013.01); *G01R 27/16* (2013.01); *H02M 1/4216* (2013.01); *H02M 5/14* (2013.01); *H02M 5/4585* (2013.01); *H02M 7/23* (2013.01); *G01R 29/16* (2013.01); *H02P 23/14* (2013.01)

(58) Field of Classification Search
CPC . G01R 21/1331; G01R 27/16; H02M 1/4216; H02M 5/14; H02M 5/4585; H02M 7/23
See application file for complete search history.

(56) References Cited

U.S. PATENT DOCUMENTS

| | | | | | |
|---|---|---|---|---|---|
| 4,247,733 | A | * | 1/1981 | Stevenson | H05B 3/0023 373/34 |
| 4,779,034 | A | * | 10/1988 | Shepard, Jr. | H02M 5/4505 318/798 |
| 5,625,548 | A | * | 4/1997 | Gold | H02M 1/08 363/98 |

(Continued)

FOREIGN PATENT DOCUMENTS

EP 2320559 A2 5/2011

OTHER PUBLICATIONS

Extended European Search for Application No. 18248131.7-1202 dated Feb. 21, 2019.

*Primary Examiner* — Adolf D Berhane
*Assistant Examiner* — Kevin H Sprenger
(74) *Attorney, Agent, or Firm* — Locke Lord LLP

(57) ABSTRACT

In accordance with an example embodiment of the invention, a three-phase power control device is configured to synchronize firing thyristor or SCR sets in consecutive combinations of two of the three phases, to supply current to consecutive combinations of two of the three loads in a three-phase load configuration, to determine real branch impedance of each load from three combinations of two supplied loads, without need of any electrical neutral reference.

9 Claims, 5 Drawing Sheets

(56) References Cited

U.S. PATENT DOCUMENTS

| | | | | |
|---|---|---|---|---|
| 5,638,263 A | * | 6/1997 | Opal | H02M 3/285 |
| | | | | 363/65 |
| 6,828,771 B1 | * | 12/2004 | Ghassemi | G01R 21/1331 |
| | | | | 324/141 |
| 9,407,133 B1 | * | 8/2016 | Alexander | H02M 1/12 |
| 2008/0067970 A1 | | 3/2008 | Qian et al. | |
| 2012/0262103 A1 | * | 10/2012 | Ek | H02M 1/34 |
| | | | | 318/778 |
| 2013/0127390 A1 | * | 5/2013 | DaCunha | H02P 5/74 |
| | | | | 318/490 |
| 2014/0104734 A1 | * | 4/2014 | Prisse | H02H 3/14 |
| | | | | 361/79 |
| 2016/0156291 A1 | * | 6/2016 | Becker | H02M 7/68 |
| | | | | 318/400.26 |

\* cited by examiner

FIG. 4

Step 402: conducting, by the power control device, a current through first and second loads of a three-phase load configuration, wherein the first and second loads are connected to first and second phases, and measuring a first voltage of the first phase to ground and a second voltage of the second phase to ground;

↓

Step 404: conducting, by the power control device, a current through the second and a third loads of the three-phase load configuration, wherein the second and third loads are connected to the second and a third phases, and measuring a third voltage of the second phase to ground and a fourth voltage of the third phase to ground;

↓

Step 406: conducting, by the power control device, a current through the third and the first loads of the three-phase load configuration, wherein the third and first loads are connected to the third and first phases, and measuring a fifth voltage of the third phase to ground and a sixth voltage of the first phase to ground; and

↓

Step 408: determining, by the power control device, based on the measured first, second, third, fourth, fifth, and sixth voltages, an impedance of the first load, an impedance of the second load, and an impedance of the third load, without the need of any electrical neutral reference.

METHOD TO DETERMINE THREE-PHASE LOAD IMPEDANCES DRIVEN BY A POWER CONTROL DEVICE WHEN NO NEUTRAL REFERENCE IS AVAILABLE IN AN ALTERNATIVE ELECTRICAL NETWORK

BACKGROUND OF THE INVENTION

1. Field of the Invention

A three-phase power control device includes three-phase firing control that drives a three-phase load when no neutral reference available. The invention determines impedance of each load of a three-phase load, without the need of any electrical neutral reference.

2. Discussion of the Related Art

On three-phase power control devices, power control of an electrical load may be managed without the need of any electrical neutral reference. However, in case with star (3S) or delta (3D) load configurations, it is not possible to determine branch impedance of a three-phase load and equivalent impedance is given instead.

The state of the art may be represented by U.S. Patent publication 2015/0309094, which discloses a system and method for measuring active power in a load without a load voltage. The method selects set of samples to determine the active power used in an electrical circuit, based on a threshold level of a measured load current. The method includes synchronizing the sampling of the line voltage and the load current such that line voltage samples and the load current samples are taken at the same time. The method includes multiplying the synchronized samples of the line voltage and the load current, and summing the products over time to determine the active power.

What is needed is a method to allow monitoring of real load impedance of each load of a three-phase load configuration, without the need of any electrical neutral reference.

SUMMARY OF THE INVENTION

In accordance with an example embodiment of the invention, a three-phase power control device includes three-phase firing control that drives a three-phase load configuration when no neutral reference available. The invention determines real load impedance of each load of a three-phase load configuration, without the need of any electrical neutral reference.

The three-phase power control device monitors voltages on a star (3S) connected load configuration or a delta (3D) connected load configuration, when only two of the three load branches are supplied, to determine real branch impedance of each load from three combinations of two supplied loads, without the need of any electrical neutral reference, in accordance with an example embodiment of the invention.

In an example embodiment of the invention, a plurality of current sensors associated with the three-phase power control device, connect with corresponding phases of a three-phase power system providing power to a three-phase motor or heater. Each current sensor provides a value representative of current flow it senses through each corresponding phase of the three-phase power system. A plurality of voltage taps associated with the three-phase power control device, connect with the corresponding phases of the three-phase power system providing power to the three-phase motor or heater.

A memory in the power control device, is configured to store a thyristor or SCR firing algorithm for firing full wave thyristor or SCR sets in corresponding phases of the three-phase power system, to conduct current in the corresponding phases of the three-phase power system.

A processor in the power control device, is coupled to the memory and the plurality of current sensors and voltage taps, configured to synchronize firing the thyristor or SCR sets in consecutive combinations of two of the three phases, to supply current to consecutive combinations of two of the three loads in the three-phase load configuration, to determine real branch impedance of each load from three combinations of two supplied loads, without need of any electrical neutral reference.

In an example embodiment of the invention, a method for operating a three-phase power control device for a three-phase load configuration, comprises:

conducting, by the power control device, a current through first and second loads of a three-phase load configuration, wherein the first and second loads are connected to first and second phases, and measuring a first voltage of the first phase to ground and a second voltage of the second phase to ground;

conducting, by the power control device, a current through the second and a third loads of the three-phase load configuration, wherein the second and third loads are connected to the second and a third phases, and measuring a third voltage of the second phase to ground and a fourth voltage of the third phase to ground;

conducting, by the power control device, a current through the third and the first loads of the three-phase load configuration, wherein the third and first loads are connected to the third and first phases, and measuring a fifth voltage of the third phase to ground and a sixth voltage of the first phase to ground; and determining, by the power control device, based on the measured first, second, third, fourth, fifth, and sixth voltages, an impedance of the first load, an impedance of the second load, and an impedance of the third load, without the need of any electrical neutral reference.

The three-phase load configuration may be a star (3S) connected load configuration or a delta (3D) connected load configuration.

DESCRIPTION OF THE FIGURES

Example embodiments of the invention are depicted in the accompanying drawings that are briefly described as follows:

FIG. 4 illustrates an example embodiment of the invention, showing a system flow diagram of an example method for operating the three-phase power control device monitoring voltages on a star (3S) or delta (3D) connected three-phase load configuration, such as a motor or heater, when only two of the three load branches are supplied, to determine real branch impedance of each load from three combinations of two supplied loads, without the need of any electrical neutral reference.

DETAILED DESCRIPTION OF EMBODIMENTS OF THE INVENTION

In accordance with an example embodiment of the invention, a three-phase power control device includes three-phase firing control that drives a three-phase load configuration when no neutral reference available. The invention determines real load impedance of each load of a three-phase load configuration, without the need of any electrical neutral reference.

The three-phase power control device monitors voltages on a star (3S) connected load configuration or a delta (3D) connected load configuration, when only two of the three load branches are supplied, to determine real branch impedance of each load from three combinations of two supplied loads, without the need of any electrical neutral reference, in accordance with an example embodiment of the invention.

Figure 1A:
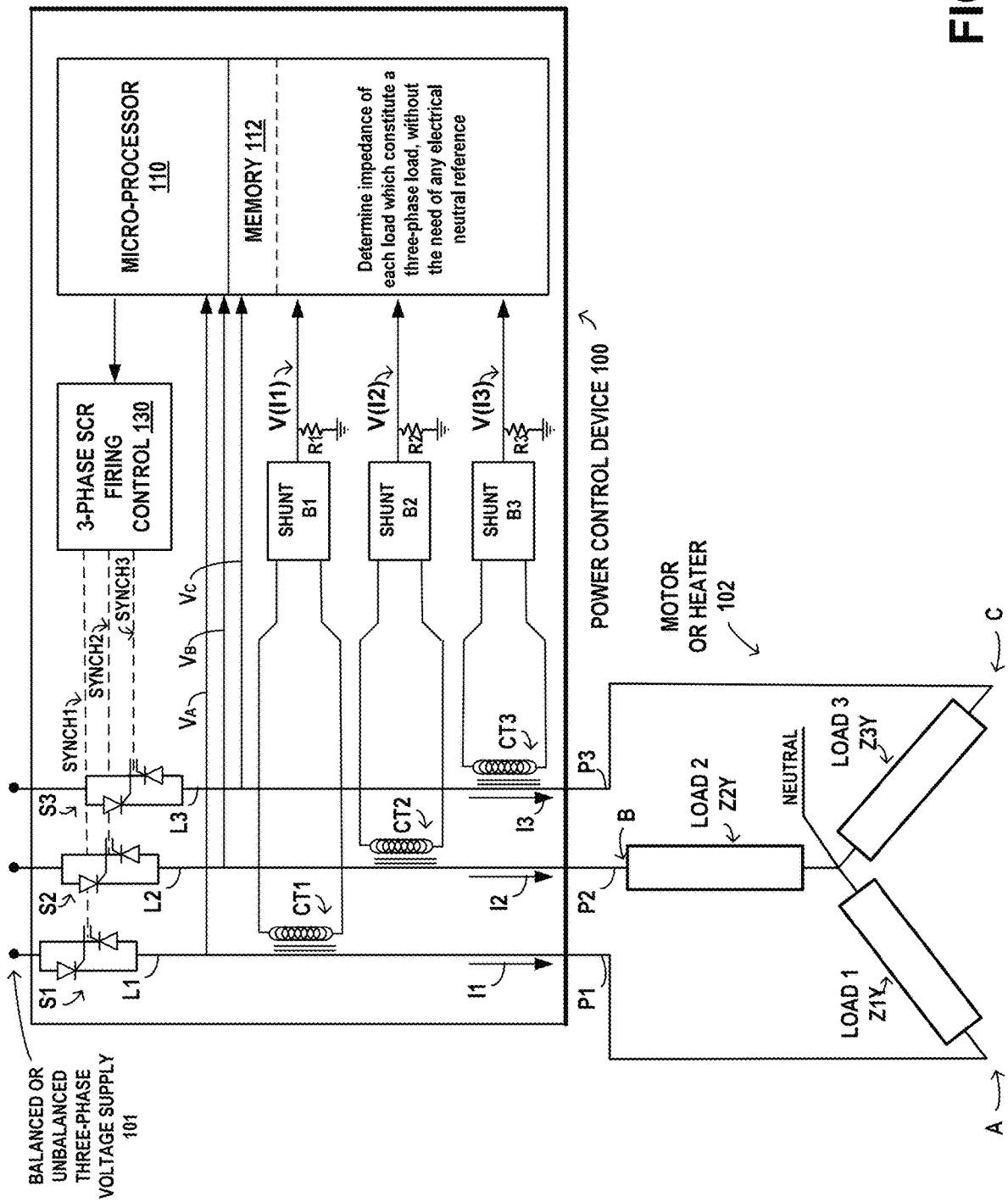
FIG. 1A is an example functional block diagram of the three-phase power control device monitoring voltages on a star (3S) connected three-phase load configuration, such as a motor or heater, when only two of the three load branches are supplied, to determine real branch impedance of each load from three combinations of two supplied loads, without the need of any electrical neutral reference, in accordance with an example embodiment of the invention.

FIG. 1A is an example functional block diagram of the three-phase power control device 100 monitoring voltages on a star (3S) connected three-phase load configuration 102, such as a motor or heater, when only two of the three load branches are supplied, to determine real branch impedance of each load from three combinations of two supplied loads, without the need of any electrical neutral reference, in accordance with an example embodiment of the invention.

Figure 1B:
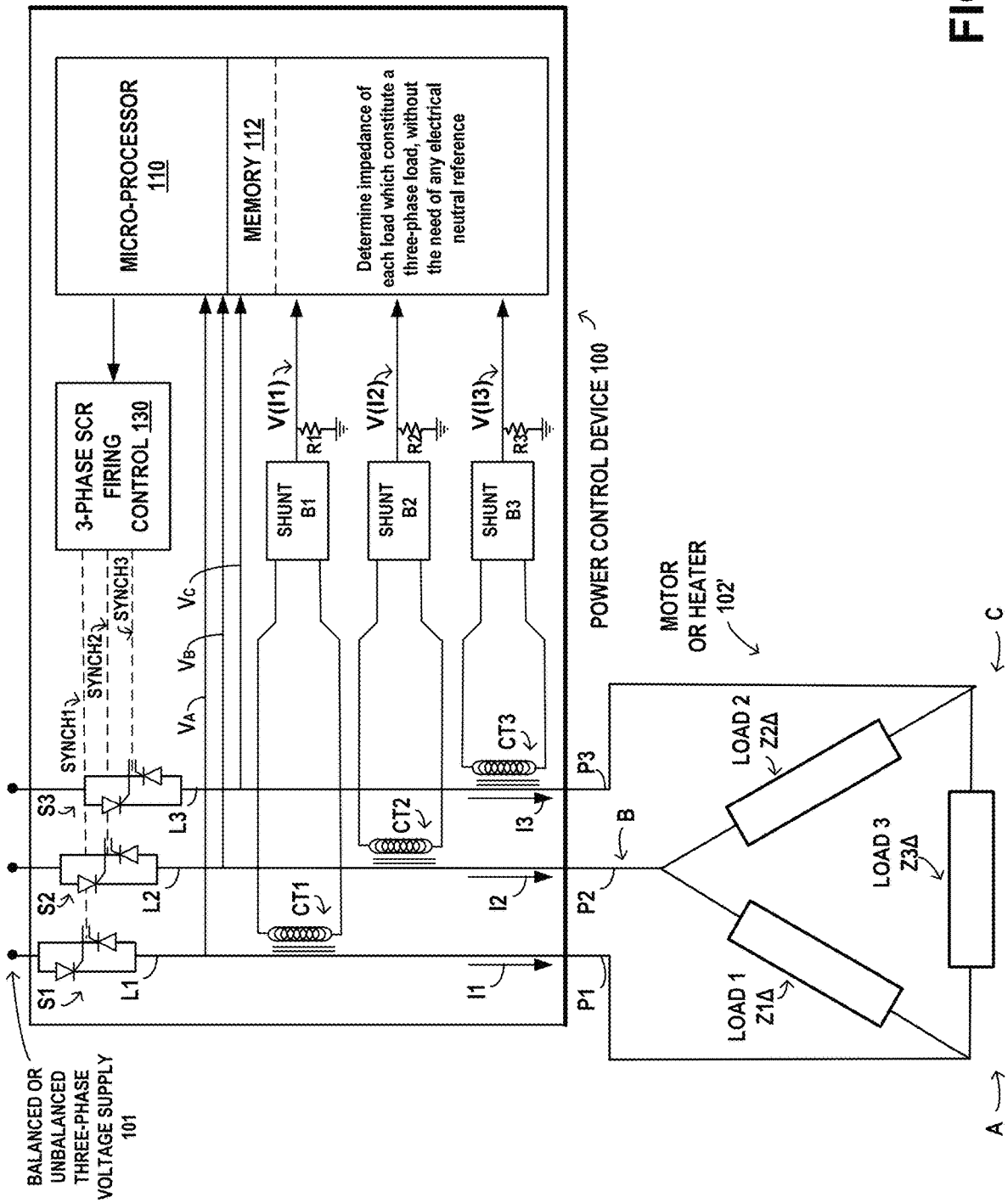
FIG. 1B is an example functional block diagram of the three-phase power control device monitoring voltages on a delta (3D) connected three-phase load configuration, such as a motor or heater, when only two of the three load branches are supplied, to determine real branch impedance of each load from three combinations of two supplied loads, without the need of any electrical neutral reference, in accordance with an example embodiment of the invention.

The power control device 100 is connected to a balanced or unbalanced three-phase voltage supply 101. The balanced or unbalanced three-phase voltage supply 101 supplies a three-phase alternating current I1, I2, and I3 to lines L1, L2 and L3. This three-phase alternating current supply is fed to a three-phase motor 102, or alternately a three-phase heater, through full wave or back-to-back thyristor or SCR sets S1, S2, and S3, respectively. The power control device 100 conducts three-phase currents I1, I2, and I3, to the power input nodes A, B, and C of the three-phase motor or heater 102. The stator winding or heater coil loads load_1 Z1Y, load_2 Z2Y, and load_3 Z3Y are respectively connected between the power input nodes A, B, and C and neutral in the star (3S) configuration, as shown in FIG. 1A. Alternately, the stator winding or heater coil loads load_1 Z1Δ, load_2 Z2Δ, and load_3 Z3Δ may be connected between the power input nodes A, B, and C in the delta (3D) configuration, as shown in FIG. 1B. When the thyristor or SCR sets S1, S2, and S3 are conducting, three-phase currents I1, I2, and I3 are delivered to the loads load_1 Z1Y, load_2 Z2Y, and load_3 Z3Y in the star (3S) configuration, or to the loads Load_1 Z1Δ, load_2 Z2Δ, Load_3 Z3Δ in the delta (3D) configuration.

The term "thyristor" includes many types of semiconductor switches, but the most widely used is the Silicon Controlled Rectifier (SCR). This paper refers to the SCR, but other types of thyristor devices may be substituted for the SCR as it is described herein. Each of the SCRs within the three sets S1, S2, and S3 only conducts when its anode is positive with respect to the cathode and a gate signal is applied, and two SCRs in each phase line form an inverse parallel connection that produces full wave control. The controlled output of the SCR sets S1, S2, and S3 is accomplished by varying the timing of the gate pulses supplied to each pair of the SCRs in each of the three-phase power lines via the gate firing line sets SYNCH1, SYNCH2, and SYNCH3, respectively output from the three-phase SCR firing control circuit 130.

The three-phase SCR firing control 130 controls the conduction state of the SCR sets S1, S2, and S3. The controlled output of the SCR sets S1, S2, and S3 is accomplished by varying the timing of the gate firing SYNCH1, SYNCH2, and SYNCH3 applied to each pair of SCRs in each of the three-phase power lines. Phase angle firing is accomplished by three-phase SCR firing control circuit 130 to turn on the SCRs during each consecutive half cycle. The turn-on point is varied within the half cycle time frame to achieve time control. If the gate pulse is applied early in the half cycle, the output is high. If the gate pulse is applied late in the cycle, only a small increment of the waveform is passed through, and therefore the output is low. The point at which the pulse is applied is continuously varied across the half cycle.

The current transformers CT1, CT2, and CT3 associated with the power control device 100, are inductively coupled to the currents I1, I2, and I3, and output a sensing current to respective shunts B1, B2, and B3. The shunts B1, B2, and B3 output voltage signals V(I1), V(I2), and V(I3), to a microprocessor 110 and memory 112 in the power control device. The V(I) waveform is identical to the current I waveform and the sign of the current may be detected and used by the SCR firing calculation algorithm 120. The current transformers CT1, CT2, and CT3 may be located inside the housing of the power control device or they may be located outside of it. A plurality of voltage taps $V_A$, $V_B$, and $V_C$ associated with the power control device, connect with the corresponding phases of the three-phase power system. $V_A$, $V_B$, and $V_C$ are the voltages to ground of the respective phases P1, P2, and P3 of the three-phase power system.

The microprocessor 110 and memory 112 receive and analyze the values representing the currents I1, I2, and I3, and the $V_A$, $V_B$, and $V_C$ are the voltages to ground on the three-phase lines L1, L2 and L3, to determine real branch impedance of each load from three combinations of two supplied loads, without the need of any electrical neutral reference. The power control device 100 automatically adjusts the point at which the firing pulse is applied by the three-phase SCR firing control 130 to the respective SCR set S1, S2, and S3, which in turn supplies the current at the terminals A, B, and C to motor or heater 102. The microprocessor 110 and memory 112 sample the voltages $V_A$, $V_B$, and $V_C$ in lines L1, L2 and L3 and currents I1, I2, and I3, and command the three-phase SCR firing control 130 to correspondingly control the respective SCR sets S1, S2, and S3. The firing the thyristor or SCR sets is synchronized in consecutive combinations of two of the three phases, to supply current to consecutive combinations of two of the three loads in the three-phase load configuration, to determine real branch impedance of each load from three combinations of two supplied loads, without need of any electrical neutral reference. Each of the three-phase lines L1, L2, and L3 contains one set of the back-to-back SCRs S1, S2, and S3 and the microprocessor 110 and memory 112 sense voltage to ground of each of these three phases.

The memory 112 stores an SCR firing calculation algorithm 120. The processor 110 in the power control device 100, coupled to the memory 112 and the plurality of current transformers CT1, CT2, and CT3 and voltage taps $V_A$, $V_B$, and $V_C$, is configured to synchronize firing the thyristor or SCR sets in consecutive combinations of two of the three phases, to supply current to consecutive combinations of two of the three loads in the three-phase load configuration, to determine real branch impedance of each load from three combinations of two supplied loads, without need of any electrical neutral reference. The memory 112 may be a permanent component of the power control device 100 or it may be a removable storage device, such as a removable semiconductor memory device. The memory 112 may store computer executable program code recorded on a computer readable, non-transitory storage medium, which when executed by the microprocessor 110, causes the power control device 100 to carry out the functions of the invention.

With the invention, the power control device determines impedance of each load of a three-phase load, without the need of any electrical neutral reference.

FIG. 1B is an example functional block diagram of the three-phase power control device monitoring voltages on a delta (3D) connected three-phase load configuration 102', such as a motor or heater, when only two of the three load branches are supplied, to determine real branch impedance of each load from three combinations of two supplied loads, without the need of any electrical neutral reference, in accordance with an example embodiment of the invention.

Figure 2:
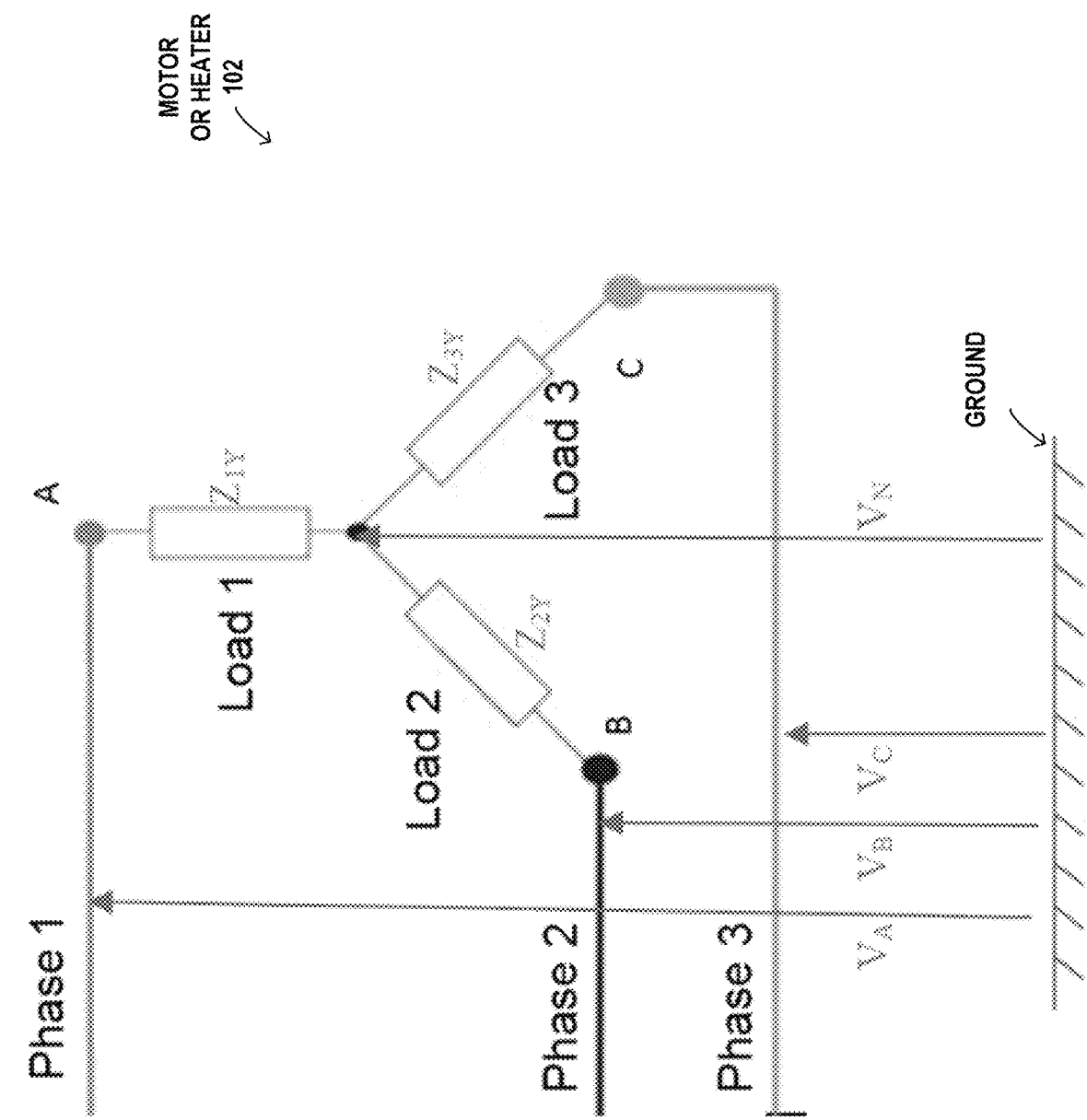
FIG. 2 is an example diagram of the star (3S) connected motor or heater.

FIG. 2 is an example diagram of the star (3S) connected motor or heater 102. The power control device 100 conducts a current through load_1 Z1Y and load_2 Z2Y with thyristors S1 and S2. The load_1 Z1Y and load_2 Z2Y are connected at points A and B to phases P1 and P2. The power control device 100 measures a first voltage $V_A$ of the first phase P1 to ground and a second voltage $V_B$ of the second phase P2 to ground. The third voltage $V_C$ of the third phase P3 to ground is given by:

Thy S1 & S2:

$$V_C = \frac{V_A \times Z2 + V_B \times Z1}{Z2 + Z1}$$

When Thyristor S1 & S2 only are conducting, there is no current in load_3 Z3Y. Therefore $V_N = V_C$. Then Millman's Theorem leads to $$V_C = \frac{V_A \times Z2 + V_B \times Z1}{Z2 + Z1}.$$

Similarly, the power control device 100 conducts a current through load_2 Z2Y and load_3 Z3Y with thyristors S2 and S3. The load_2 Z2Y and load_3 Z3Y are connected at points B and C to phases P2 and P3. The power control device 100 measures a first voltage $V_B$ of the first phase P2 to ground and a second voltage $V_C$ of the second phase P3 to ground. The third voltage $V_A$ of the third phase P1 to ground is given by:

Thy 2 & 3:

$$V_A = \frac{V_B \times Z3 + V_C \times Z2}{Z3 + Z2}$$

Similarly, the power control device 100 conducts a current through load_3 Z3Y and load_1 Z1Y with thyristors S3 and S1. The load_3 Z3Y and load_1 Z1Y are connected at points C and A to phases P3 and P1. The power control device 100 measures a first voltage $V_C$ of the first phase P3 to ground and a second voltage $V_A$ of the second phase P1 to ground. The third voltage $V_B$ of the third phase P2 to ground is given by:

Thy 3 & 1:

$$V_B = \frac{V_C \times Z1 + V_A \times Z3}{Z1 + Z3}$$

Figure 3:
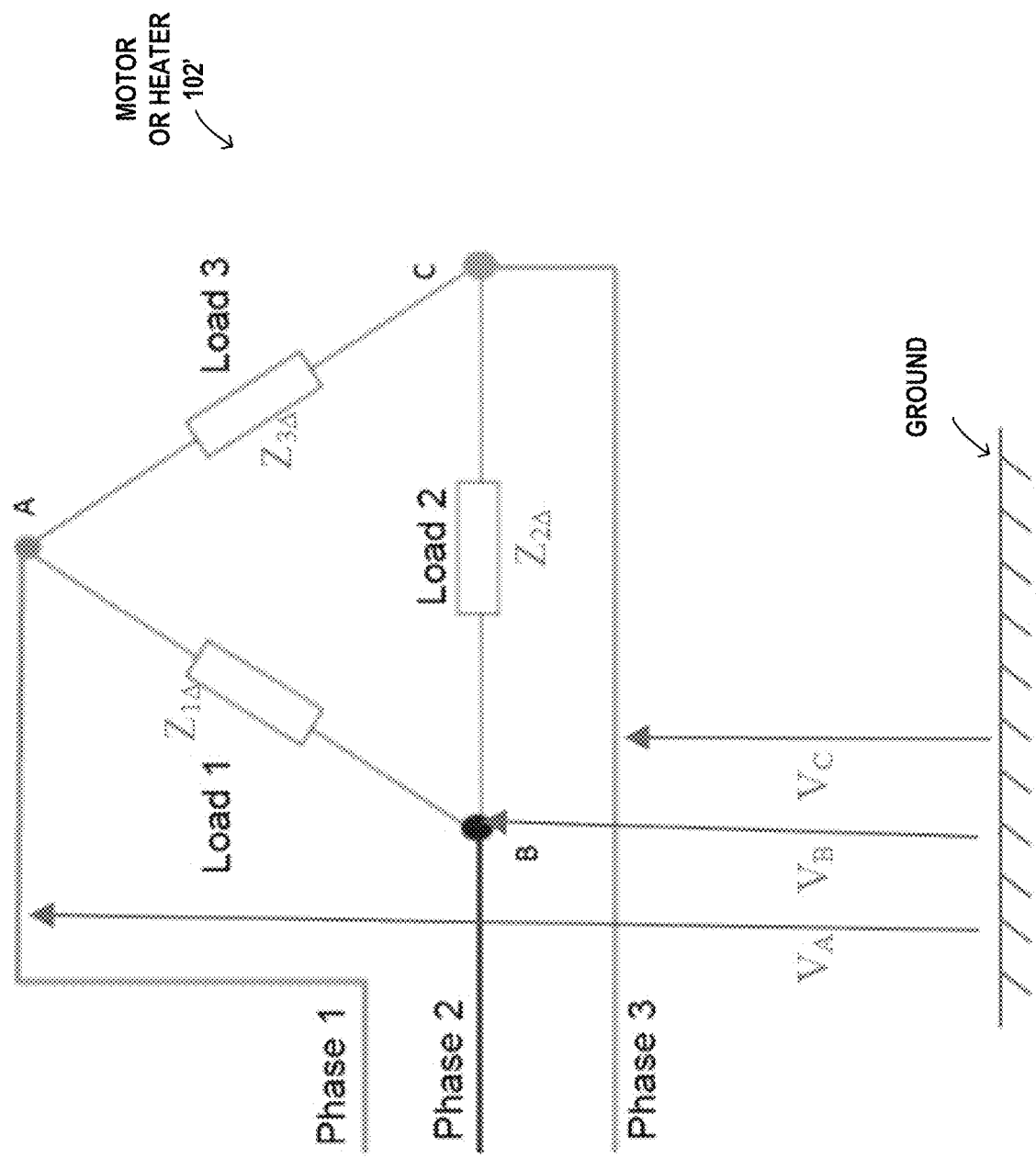
FIG. 3 is an example diagram of the delta (3D) connected motor or heater.

FIG. 3 is an example diagram of the delta (3D) connected motor or heater 102'. The power control device 100 conducts a current through load_1 Z1Δ and load_2 Z2Δ with thyristors S1 and S2. The load_1 Z1Δ and load_2 Z2Δ are connected at points A and B to phases P1 and P2. The power control device 100 measures a first voltage $V_A$ of the first phase P1 to ground and a second voltage $V_B$ of the second phase P2 to ground. The third voltage $V_C$ of the third phase P3 to ground is given by:

Thy 1 & 2:

$$V_C = \frac{V_A \times Z2 + V_B \times Z3}{Z2 + Z3}$$

When Thyristor S1 & S2 only are conducting, $V_C$ relies only on $V_A$ and $V_B$. Then Millman's Theorem leads to $$V_C = \frac{V_A \times Z2 + V_B \times Z3}{Z2 + Z3}.$$

Similarly, the power control device 100 conducts a current through load_2 Z2Δ and load_3 Z3Δ with thyristors S2 and S3. The load_2 Z2Δ and load_3 Z3Δ are connected at points B and C to phases P2 and P3. The power control device 100 measures a first voltage $V_B$ of the first phase P2 to ground and a second voltage $V_C$ of the second phase P3 to ground. The third voltage $V_A$ of the third phase P1 to ground is given by:

Thy 2 & 3:

$$V_A = \frac{V_B \times Z3 + V_C \times Z1}{Z3 + Z1}$$

Similarly, the power control device 100 conducts a current through load_3 Z3Δ and load_1 Z1Δ with thyristors S3 and S1. The load_3 Z3Δ and load_1 Z1Δ are connected at points C and A to phases P3 and P1. The power control device 100 measures a first voltage $V_C$ of the first phase P3 to ground and a second voltage $V_A$ of the second phase P1 to ground. The third voltage $V_B$ of the third phase P2 to ground is given by:

Thy 3 & 1:

$$V_B = \frac{V_C \times Z1 + V_A \times Z2}{Z1 + Z2}$$

When only 2 thyristors are conducting equivalent impedance Zeq can be determined using voltage and current.

3S Configuration:
Thy 1 & 2:

$$Zeq1 = \frac{V_A - V_B}{I1} = Z1Y + Z2Y.$$

When only thyristor 1 & 2 are conducting, current is going through Z1 and Z2 only.

Thy 2 & 3:

$$Zeq2 = \frac{V_B - V_C}{I2} = Z2Y + Z3Y$$

Thy 3 & 1:

$$Zeq3 = \frac{V_C - V_A}{I3} = Z3Y + Z1Y$$

Therefore, resolving the three equations with three unknowns Z1Y, Z2Y, Z3Y leads to:

$$Z1Y = \frac{Zeq1 - Zeq2 + Zeq3}{2}.$$

since Zeq1, Zeq2 and Zeq3 are known, Z1Y, Z2Y and Z3Y can be determined.

$$Z2Y = \frac{Zeq1 + Zeq2 - Zeq3}{2}$$

$$Z3Y = \frac{-Zeq1 + Zeq2 + Zeq3}{2}$$

3D Configuration:
Kennely transformation leads to:

$$Z1\Delta = \frac{Z1Y \times Z2Y}{Z3Y} + Z1Y + Z2Y.$$

These are the Z1Y, Z2Y, Z3Y values calculated for the star (3S) configuration $$Z2\Delta = \frac{Z2Y \times Z3Y}{Z1Y} + Z2Y + Z3Y$$

$$Z3\Delta = \frac{Z3Y \times Z1Y}{Z2Y} + Z3Y + Z1Y$$

Therefore, we obtain:

$$Z1\Delta = \frac{Z1Y \times Z2Y}{Z3Y} + Zeq1$$

What is measured is Vrms and Irms when only two thyristors are conducting. Then $$Zeq1 = \frac{V_A - V_B}{I1},$$

$$Zeq2 = \frac{V_B - V_C}{I2}$$

and $$Zeq3 = \frac{V_C - V_A}{I3}$$

equations are always true whatever load coupling.

Z1Y, Z2Y and Z3Y are always computed and used to compute Z1Δ, Z2Δ, Z2Δ if coupling is Delta.

$$Z2\Delta = \frac{Z2Y \times Z3Y}{Z1Y} + Zeq2$$

$$Z3\Delta = \frac{Z3Y \times Z1Y}{Z2Y} + Zeq3$$

Thus, the power control device 100 is able to determine, based on the measured first, second, third, fourth, fifth, and sixth voltages to ground, an impedance of the first load, an impedance of the second load, and an impedance of the third load, without the need of any electrical neutral reference.

FIG. 4 illustrates an example embodiment of the invention, showing a system flow diagram of an example method for operating the three-phase power control device monitoring voltages on a star (3S) or delta (3D) connected three-phase load configuration, such as a motor or heater, when only two of the three load branches are supplied, to determine real branch impedance of each load from three combinations of two supplied loads, without the need of any electrical neutral reference. The steps of the flow diagram represent computer code instructions stored in the memory 112 of the power control device, which when executed by the processor 110, carry out the functions of the example embodiments of the invention. The steps may be carried out in another order than shown and individual steps may be combined or separated into component steps. The flow diagram has the following steps:

Step 402: conducting, by the power control device, a current through first and second loads of a three-phase load configuration, wherein the first and second loads are connected to first and second phases, and measuring a first voltage of the first phase to ground and a second voltage of the second phase to ground;

Step 404: conducting, by the power control device, a current through the second and a third loads of the three-phase load configuration, wherein the second and third loads are connected to the second and a third phases, and measuring a third voltage of the second phase to ground and a fourth voltage of the third phase to ground;

Step 406: conducting, by the power control device, a current through the third and the first loads of the three-phase load configuration, wherein the third and first loads are connected to the third and first phases, and measuring a fifth voltage of the third phase to ground and a sixth voltage of the first phase to ground; and Step 408: determining, by the power control device, based on the measured first, second, third, fourth, fifth, and sixth voltages, an impedance of the first load, an impedance of the second load, and an impedance of the third load, without the need of any electrical neutral reference.

The resulting invention provides a three-phase power control device configured to monitor voltages on a three-phase load configuration, when only two of the three load branches are supplied, to determine real branch impedance of each load from three combinations of two supplied loads, without the need of any electrical neutral reference, in accordance with an example embodiment of the invention.

Although specific example embodiments of the invention have been disclosed, persons of skill in the art will appreciate that changes may be made to the details described for the specific example embodiments, without departing from the spirit and the scope of the invention.

The invention claimed is:

1. A three-phase power control device for a three-phase load configuration, comprising:
   a plurality of current sensors associated with the three-phase power control device, connect with corresponding first, second, and third phases of a three-phase power system providing power to a three-phase load configuration comprising a respective first load, a second load, and a third load, wherein each current sensor provides a value representative of current flow it senses through each corresponding phase of the three-phase power system;
   a plurality of voltage taps associated with the three-phase power control device, connected with the corresponding phases of the three-phase power system providing power to the three-phase load configuration;
   three full wave thyristor or SCR sets in corresponding phases of the three-phase power system, to conduct current in the corresponding phases of the three-phase power system;
   a memory in the power control device, configured to store a thyristor or SCR firing algorithm for firing the full wave thyristor or SCR sets in the corresponding phases of the three-phase power system, to conduct current in the corresponding phases of the three-phase power system; and
   a processor in the power control device, coupled to the memory and the plurality of current sensors and voltage taps, configured to synchronize firing the thyristor or SCR sets in consecutive combinations of two of the three phases, to supply current to consecutive combinations of two of the three loads in the three-phase load configuration, by sequentially causing a first thyristor or SCR set to turn off current in the first load and measuring voltages of the second and the third phases and measuring current through the second and third loads, by sequentially causing a second thyristor or SCR set to turn off current in the second load and measuring voltages of the first and the third phases and measuring current through the first and third loads, and by sequentially causing a third thyristor or SCR set to turn off current in the third load and measuring voltages of the second and the first phases and measuring current through the first and second loads, to determine, based on the measured voltages and currents, real branch impedance of each of the first load, the second load, and the third load from three combinations of two supplied loads, without need of any electrical neutral reference.

2. The three-phase power control device of claim 1, wherein the three-phase power control device monitors voltages on a star (3S) connected load configuration or a delta (3D) connected load configuration, when only two of the three load branches are supplied.

3. The three-phase power control device of claim 1, wherein the three-phase load configuration is a three-phase induction motor or a three-phase heater.

4. A method for operating a three-phase power control device for a three-phase load configuration, comprises:
   synchronizing, by the power control device, firing first, second, and third thyristor or SCR sets in consecutive combinations of two of three phases, to supply current to consecutive combinations of two of three loads in a three-phase load configuration of first, second, and third loads;
   sequentially conducting, by the power control device, a first current through the first and second loads and turning off current in the third load by means of the third thyristor or SCR set, of the three-phase load configuration, wherein the first and second loads are connected to first and second phases, and measuring a first voltage of the first phase to ground and a second voltage of the second phase to ground and measuring the first current through the first and second loads;
   sequentially conducting, by the power control device, a second current through the second and the third loads and turning off current in the first load by means of the first thyristor or SCR set, of the three-phase load configuration, wherein the second and third loads are connected to the second and a third phases, and measuring a third voltage of the second phase to ground and a fourth voltage of the third phase to ground and measuring the second current through the second and third loads;
   sequentially conducting, by the power control device, a third current through the third and the first loads and turning off current in the second load by means of the second thyristor or SCR set, of the three-phase load configuration, wherein the third and first loads are connected to the third and first phases, and measuring a fifth voltage of the third phase to ground and a sixth voltage of the first phase to ground and measuring the third current through the third and first loads; and
   determining, by the power control device, based on the measured first, second, third, fourth, fifth, and sixth voltages, and the measured first, second, and third currents, a real branch impedance of the first load, a real branch impedance of the second load, and a real branch impedance of the third load, from three combinations of two supplied loads, without the need of any electrical neutral reference.

5. The method for operating a three-phase power control device of claim 4, wherein the three-phase power control device monitors voltages on a star (3S) connected load configuration or a delta (3D) connected load configuration, when only two of the three load branches are supplied.

6. The method for operating a three-phase power control device of claim 4, wherein the three-phase load configuration is a three-phase induction motor or a three-phase heater.

7. A computer program product for operating a three-phase power control device for a three-phase load configuration, comprising computer executable program code recorded on a computer readable, non-transitory storage medium, which when executed by a computer processor, causes the power control device to carry out functions, the computer executable program code comprising:
   code for synchronizing, by the power control device, firing first, second, and third thyristor or SCR sets in consecutive combinations of two of three phases, to supply current to consecutive combinations of two of three loads in a three-phase load configuration of first, second, and third loads;
   code for causing the power control device to sequentially conduct a first current through the first and second loads and turning off current in the third load by means of the third thyristor or SCR set, of the three-phase load configuration, wherein the first and second loads are connected to first and second phases, and measuring a first voltage of the first phase to ground and a second voltage of the second phase to ground and measuring the first current through the first and second loads;

code for causing the power control device to sequentially conduct a second current through the second and the third loads and turning off current in the first load by means of the first thyristor or SCR set, of the three-phase load configuration, wherein the second and third loads are connected to the second and a third phases, and measuring a third voltage of the second phase to ground and a fourth voltage of the third phase to ground and measuring the second current through the second and third loads;

code for causing the power control device to sequentially conduct a third current through the third and the first loads and turning off current in the second load by means of the second thyristor or SCR set, of the three-phase load configuration, wherein the third and first loads are connected to the third and first phases, and measuring a fifth voltage of the third phase to ground and a sixth voltage of the first phase to ground and measuring the third current through the third and first loads; and code for causing the power control device to determine, based on the measured first, second, third, fourth, fifth, and sixth voltages, and the measured first, second, and third currents, a real branch impedance of the first load, a real branch impedance of the second load, and a real branch impedance of the third load, from three combinations of two supplied loads, without the need of any electrical neutral reference.

8. The computer program product for operating a three-phase power control device of claim 7, wherein the three-phase power control device monitors voltages on a star (3S) connected load configuration or a delta (3D) connected load configuration, when only two of the three load branches are supplied.

9. The computer program product for operating a three-phase power control device of claim 7, wherein the three-phase load configuration is a three-phase induction motor or a three-phase heater.

* * * * *